United States Patent
Yamamoto et al.

(10) Patent No.: US 7,474,169 B2
(45) Date of Patent: *Jan. 6, 2009

(54) ATTENUATOR

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 197 days.

This patent is subject to a terminal disclaimer.

(21) Appl. No.: 11/553,563

(22) Filed: Oct. 27, 2006

(65) Prior Publication Data

US 2007/0268096 A1 Nov. 22, 2007

(30) Foreign Application Priority Data

May 17, 2006 (JP) .............................. 2006-137860

(51) Int. Cl.
*H01P 1/22* (2006.01)
*H03H 7/24* (2006.01)
(52) U.S. Cl. ..................................... 333/81 R; 327/308
(58) Field of Classification Search ............... 333/81 R; 327/308
See application file for complete search history.

(56) References Cited

U.S. PATENT DOCUMENTS

2003/0062967 A1* 4/2003 Ritchey et al. ............ 333/81 R

2003/0218500 A1 11/2003 Yamamoto et al.

FOREIGN PATENT DOCUMENTS

| JP | 2003-347870 | 12/2003 |
|---|---|---|
| JP | 2005-73010 | 3/2005 |

OTHER PUBLICATIONS

K. Yamamoto et al.; "A Study on a GaAs-Based AC-Coupled, Stack-Type Diode Switch and Its Application to a Step Attenuator", Proceedings of the 2005 IEICE Electronics Society Conf., C-10-1, (Sep. 20-23, 2005), Hokkaido Univ.

* cited by examiner

*Primary Examiner*—Stephen E Jones
(74) *Attorney, Agent, or Firm*—Leydig, Voit & Mayer, Ltd.

(57) ABSTRACT

An attenuator includes a first diode, a first control voltage terminal, a second diode, a first resistance, a second resistance, a third diode, a fourth diode, a fifth capacitance, a second control voltage terminal, a third control voltage terminal, a fourth control voltage terminal, and a linearizer provided between an input terminal and the anode of the first diode. The linearizer linearizes a signal input to the input terminal only when low level voltages are applied to the first and fourth control voltage terminals at the same time that high level voltages are applied to the second and third control voltage terminals.

9 Claims, 9 Drawing Sheets

ATTENUATOR

BACKGROUND OF THE INVENTION

1. Field of the Invention

The present invention relates to a DC stack type AC-coupling BC diode attenuator, and more particularly to an attenuator adapted to have substantially constant distortion characteristics up to a certain (high) transmission power level both in the attenuating and non-attenuating states.

2. Background Art

In recent years, GaAs-HBT (Heterojunction Bipolar Transistor) power amplifiers have been widely used as cellular phone power amplifiers for CDMA (Code Division Multiple Access), etc. and wireless LAN power amplifiers.

GaAs-HBTs do not require a negative gate bias voltage, which allows them to operate on a single power source. Furthermore, their device characteristics do not vary as much as those of GaAs-FETs. Therefore, recently, GaAs-HBTs have been increasingly used in GaAs power amplifiers for cellular phones and wireless LANs.

However, a GaAs-HBT process usually cannot form a RF (radio frequency) switching device whose channel can be turned on by application of a gate voltage alone. Therefore, such a switching device is made up of a base-collector junction diode (or BC diode), which has characteristics similar to those of a p-i-n junction (or diode). (See, e.g., Japanese Laid-Open Patent Publication No. 2003-347870)

FIG. 14 is a circuit diagram of a conventional switch employing a BC diode. Specifically, this switch includes: a diode D1 having an anode and a cathode connected to an input terminal IN and an output terminal OUT, respectively; a control voltage terminal Vc1 connected to the anode of the diode D1 through an RF blocking inductor L1; and a resistance R1 and an RF blocking inductor L2 connected in series between the cathode of the diode D1 and a ground point.

In the switch shown in FIG. 14, when a voltage higher than the turn-on voltage of the diode D1 (that is, approximately 1.25 V) is applied to the control voltage terminal Vc1, the diode D1 switches from an off state to an on state, causing a current Idc determined by the resistance R1 to flow through the diode D1. Since the diode D1 thus assumes the on state, the RF signal input to the input terminal IN is passed to the output terminal OUT. On the other hand, when a voltage lower than the turn-on voltage of the diode D1 (including a negative bias) is applied to the control voltage terminal Vc1, the diode D1 assumes an off state, preventing the RF signal from passing through.

FIG. 15 is a circuit diagram of a conventional attenuator employing a BC diode. In addition to the components shown in FIG. 14, the attenuator includes: a resistance R01 connected at one end to the anode of the diode D1; a resistance R02 connected at one end to the cathode of the diode D1; a diode D2 having an anode and a cathode, the anode being grounded through a capacitance C2, the cathode being connected to the other end of the resistance R02 and connected to the other end of the resistance R01 through a capacitance C1; and a control voltage terminal Vc2 connected to the anode of the diode D2 through the RF blocking inductor L2 and a resistance R4.

In the attenuator shown in FIG. 15, when a voltage higher than the turn-on voltage of the diode D1 is applied to the control voltage terminal Vc1 at the same time that a voltage lower than the turn-on voltage of the diode D2 (including a negative bias) is applied to the control voltage terminal Vc2, the attenuator assumes a non-attenuating state and hence the RF signal input to the input terminal IN is passed to the output terminal OUT with no attenuation. On the other hand, when a voltage lower than the turn-on voltage of the diode D1 is applied to the control voltage terminal Vc1 at the same time that a voltage higher than the turn-on voltage of the diode D2 is applied to the control voltage terminal Vc2, the attenuator assumes an attenuating state determined by the resistances R01 and R02 and the on-resistance of the diode D2. It should be noted, however, that if the capacitances C1 and C2 are formed on the GaAs chip and hence are small, the impedance values of these capacitances at the operational frequencies are also factors in determining the amount of attenuation.

FIG. 16 is a diagram illustrating the RF signal input to the input terminal IN. In the figure, I(t) represents the RF signal, that is, the current flowing through the diode D1; Imax represents the maximum value of the amplitude of the current; and T represents the period. The maximum allowable input power to the attenuator is set such that the insertion loss is acceptably low. Specifically, the current I(t) flowing through the diode D1 is limited such that the time integral of the current for a half cycle (equal to the total amount of charge flowing during that cycle) is smaller than the product of the bias current Idc and a time constant t, as represented by equation (1) below. It should be noted that the time constant t is determined by the bonding material and the bonding conditions of the diode (i.e., the impurity concentration and thickness of the I-layer, or high resistance layer, etc.).

[Equation 1]

$$\int_0^{T/2} I(t)dt = I\max/(\pi * f) < Idc * \tau \qquad (1)$$

Thus, the lower the frequency, the smaller the power delivered through the attenuator (assuming the same bias current Idc). Especially, since the BC layer of a BC diode formed by a GaAs-HBT process is determined by the RF characteristics of the HBT, there is no freedom in design of the structure of the BC layer. Furthermore, the time constant t of a GaAs p-i-n diode is roughly two orders of magnitude smaller than that of an Si p-i-n diode, resulting in significantly reduced maximum allowable input power. Therefore, a switch or an attenuator employing a BC diode requires a large bias current to achieve desired maximum allowable transmission power.

To solve the above problems, the inventor has devised the switch and the attenuator shown in FIGS. 17 and 18, respectively.

The switch shown in FIG. 17 includes: a diode D1 having an anode and a cathode that are connected to an input terminal IN and an output terminal OUT, respectively; a control voltage terminal Vc1 connected to the anode of the diode D1 through an RF blocking inductor L1; a diode D2 having an anode connected to the cathode of the diode D1 and a cathode connected to the anode of the diode D1 through a capacitance C1; and a resistance R1 and an RF blocking inductor L2 connected in series between the cathode of the diode D2 and a ground point.

The attenuator shown in FIG. 18 is configured such that: the anode and cathode of a diode D1 are connected to an input terminal IN and an output terminal OUT, respectively; a control voltage terminal Vc1 is connected to the anode of the diode D1 through an RF blocking inductor L1; and the anode of a diode D2 is connected to the cathode of the diode D1, and the cathode of the diode D2 is connected to the anode of the diode D1 through a capacitance C1.

Further, one end of a resistance R01 is connected to the cathode of the diode D2, and one end of a resistance R02 is connected to the cathode of the diode D1 through a capacitance C2; the anode of a diode D3 is connected to the other ends of the resistances R01 and R02 through a capacitance C3, and the cathode of a diode D4 is connected to the other ends of the resistances R01 and R02 through a capacitance C4; and one end of a capacitance C5 is connected to the cathode of the diode D3 and to the anode of the diode D4, and the other end of the capacitance C5 is grounded.

Further, a control voltage terminal Vc2 is connected to the cathode of the diode D2 through an RF blocking inductor L2 and a resistance R2; a control voltage terminal Vc3 is connected to the anode of the diode D3 through an RE blocking inductor L3 and a resistance R3; and a control voltage terminal Vc4 is connected to the cathode of the diode D4 through an RF blocking inductor L4 and a resistance R4.

In the attenuator shown in FIG. 18, when voltages higher than the turn-on voltages of the diodes D1 and D4 (that is, high voltage levels) are applied to the control voltage terminals Vc1 and Vc4, respectively, at the same time that voltages lower than the turn-on voltages of the diodes D2 and D3 (that is, low voltage levels) are applied to the control voltage terminals Vc2 and Vc3, respectively, the attenuator assumes a non-attenuating state and hence the RF signal input to the input terminal IN is passed to the output terminal OUT with no attenuation. On the other hand, when voltages lower than the turn-on voltages of the diodes D1 and D4 (that is low voltage levels) are applied to the control voltage terminals Vc1 and Vc4, respectively, at the same time that voltages higher than the turn-on voltages of the diodes D2 and D3 (that is, high voltage levels) are applied to the control voltage terminals Vc2 and Vc3, respectively, the attenuator assumes an attenuating state. It should be noted that the amount of attenuation is determined by the resistances R01 and R02, the values of the capacitances C1 to C6, the bias current Idc, and the bias voltage.

Further, the diodes D1 and D2 are DC connected in series, as well as being AC connected in parallel through the capacitance C1. This allows the DC bias current Idc to flow through both the diodes D1 and D2 when a high level voltage is applied to the control voltage terminal Vc1. When the attenuator circuit is viewed as an AC circuit (viewed in terms of AC), a DC current twice as large as the bias current Idc flows. This means that the value Imax in equation (1) is increased by a factor of approximately 2. Since the maximum allowable transmission power is $Ro*(Imax)^2/2$ (where Ro is the characteristic impedance), the attenuator shown in FIG. 18 can deliver transmission power approximately 4 times as large as the maximum allowable transmission power of the attenuator shown in FIG. 15.

FIG. 19 shows the power transfer characteristics of the attenuators shown in FIGS. 15 and 18. As shown in FIG. 19, the maximum allowable transmission power level of the attenuator in FIG. 18 is approximately 6-8 dB higher than that of the attenuator in FIG. 15 (assuming the same bias current).

FIG. 20 depicts graphs illustrating the output characteristics of the attenuator of FIG. 18 when it is in its attenuating and non-attenuating states. (These graphs were obtained experimentally.) It should be noted that the vertical axis represents signal distortion, namely, the third order intermodulation distortion Pim3 (two input signals). As can be from the figure, the attenuator exhibited a dramatic increase in signal distortion when it provided 20 dB attenuation at high input power. This dramatic increase in signal distortion was not observed in the non-attenuating state. When the attenuator is used in a system using a modulating signal, such an increase in signal distortion leads to degradation of the signal quality of the system, which is not desirable.

SUMMARY OF THE INVENTION

The present invention has been devised to solve the above problems. It is, therefore, an object of the present invention to provide an attenuator adapted to have substantially constant distortion characteristics up to a certain (high) transmission power level both in the attenuating and non-attenuating states.

An attenuator of the present invention comprises a first diode, a first control voltage terminal, a second diode, a first resistance, a second resistance, a third diode, a fourth diode, a fifth capacitance, a second control voltage terminal, a third control voltage terminal, a fourth control voltage terminal, and a linearizer provided between an input terminal and the anode of the first diode, wherein the linearizer linearizes a signal input to the input terminal only when low level voltages are applied to the first and fourth control voltage terminals at the same time that high level voltages are applied to the second and third control voltage terminals.

The present invention provides an attenuator adapted to have substantially constant distortion characteristics up to a certain (high) transmission power level both in the attenuating and non-attenuating states.

Other and further objects, features and advantages of the invention will appear more fully from the following description.

BRIEF DESCRIPTION OF THE DRAWINGS

FIG. 16 is a diagram illustrating the RF signal input to the input terminal IN.

DETAILED DESCRIPTION OF THE PREFERRED EMBODIMENTS

First Embodiment

Figure 1:
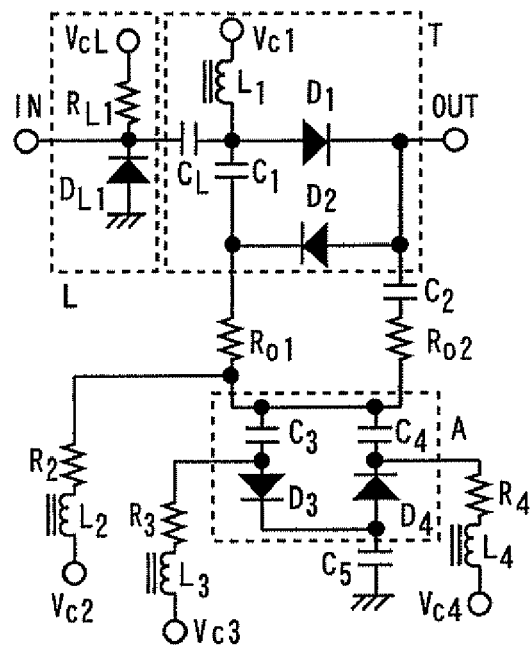
FIG. 1 is a circuit diagram of an attenuator according to a first embodiment of the present invention.

FIG. 1 is a circuit diagram of an attenuator according to a first embodiment of the present invention. Referring to the figure, the anode of a diode D1 (a first diode) is connected to an input terminal IN, and the cathode of the diode D1 is connected to an output terminal OUT. A control voltage terminal Vc1 (a first control voltage terminal) is connected to the anode of the diode D1 through an RF blocking inductor L1. The anode of a diode D2 (a second diode) is connected to the cathode of the diode D1, and the cathode of the diode D2 is connected to the anode of the diode D1 through a capacitance C1 (a first capacitance).

Further, one end of a resistance R01 (a first resistance) is connected to the cathode of the diode D2, and one end of a resistance R02 (a second resistance) is connected to the cathode of the diode D1 through a capacitance C2 (a second capacitance). The anode of a diode D3 (a third diode) is connected to the other ends of resistances R01 and R02 through a capacitance C3 (a third capacitance), and the cathode of a diode D4 (a fourth diode) is connected to the other ends of the resistances R01 and R02 through a capacitance C4 (a fourth capacitance). One end of a capacitance C5 (a fifth capacitance) is connected to the cathode of the diode D3 and to the anode of the diode D4, and the other end of the capacitance C5 is grounded.

Further, a control voltage terminal Vc2 (a second control voltage terminal) is connected to the cathode of the diode D2 through an RF blocking inductor L2 and a resistance R2; and a control voltage terminal Vc3 (a third control voltage terminal) is connected to the anode of the diode D3 through an RF blocking inductor L3 and a resistance R3; and a control voltage terminal Vc4 (a fourth control voltage terminal) is connected to the cathode of the diode D4 through an RF blocking inductor L4 and a resistance R4.

Figure 2:
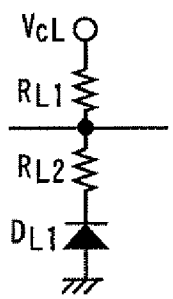
FIG. 2 is a circuit diagram of an linearizer.
Figure 3:
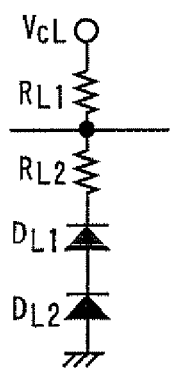
FIG. 3 is a circuit diagram of another linearizer.
Figure 4:
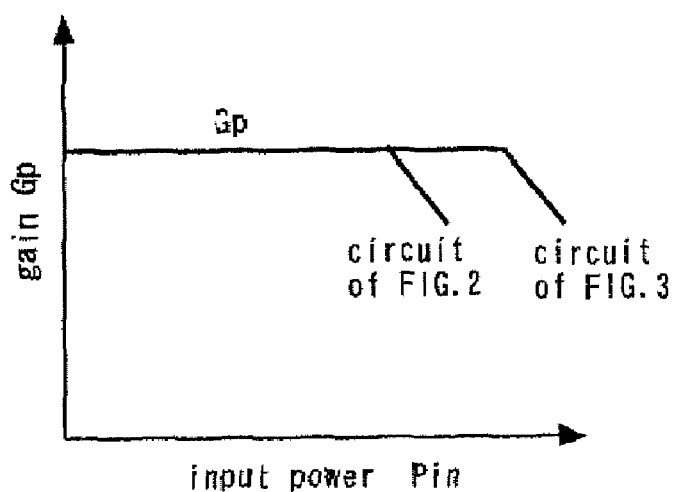
FIG. 4 shows the relationships between the input power Pin input to the linearizers shown in FIGS. 2 and 3 and their gains Gp.

Still further, a linearizer L is provided between the input terminal IN and the anode of the diode D1. The linearizer L includes: a diode DL1 (a fifth diode) having a grounded anode and a cathode connected to the connection point between the input terminal IN and the anode of the diode D1; and a resistance RL1 (a third resistance) connected between a control voltage terminal VcL (a fifth control voltage terminal) and the connection point between the input terminal IN and the anode of the diode D1. It should be noted that a resistance RL2 (a fourth resistance) may be provided between the diode DL1 and the connection point between the input terminal IN and the anode of the diode D1, as shown in FIG. 2. Further, as shown in FIG. 3, a diode DL2 (a sixth diode) may be provided which has a grounded anode and a cathode connected to the anode of the diode D1. FIG. 4 shows the relationships between the input power Pin input to the linearizers shown in FIGS. 2 and 3 and their gains Gp.

When a high level voltage (e.g., 5 V) is applied to the control voltage terminal VcL, the diode DL1 is subjected to a high reverse bias voltage and hence the linearizer L does not operate. On the other hand, applying a low level voltage (e.g., 0 V) to the control voltage terminal VcL causes the linearizer L to operate. At that time, if the input power Pin is high, the gain Gp of the linearizer L decreases, as shown in FIG. 4, which means that when the attenuator receives high power, its gain increases.

Figure 20:
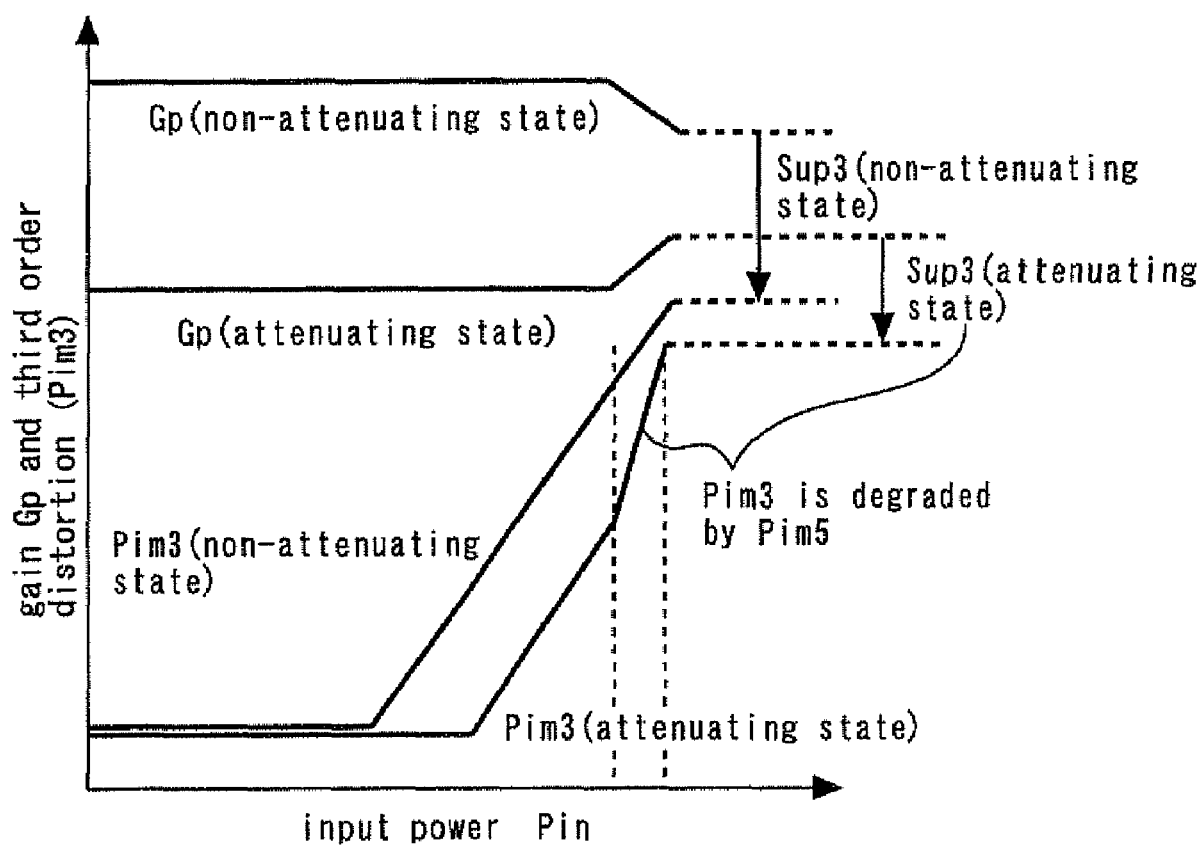
FIG. 20 depicts graphs illustrating the output characteristics of the attenuator of FIG. 18 when it is in its attenuating and non-attenuating states.

Therefore, a low level voltage is applied to the control voltage terminal VcL only when the attenuator is in its attenuating state. With this arrangement, the linearizer L operates to linearize the signal input to the input terminal IN only when the attenuator is in the attenuating state. When the attenuator is in its non-attenuating state, the linearizer L does not operate and hence the attenuator delivers the non-attenuating characteristics shown in FIG. 20.

Figure 5:
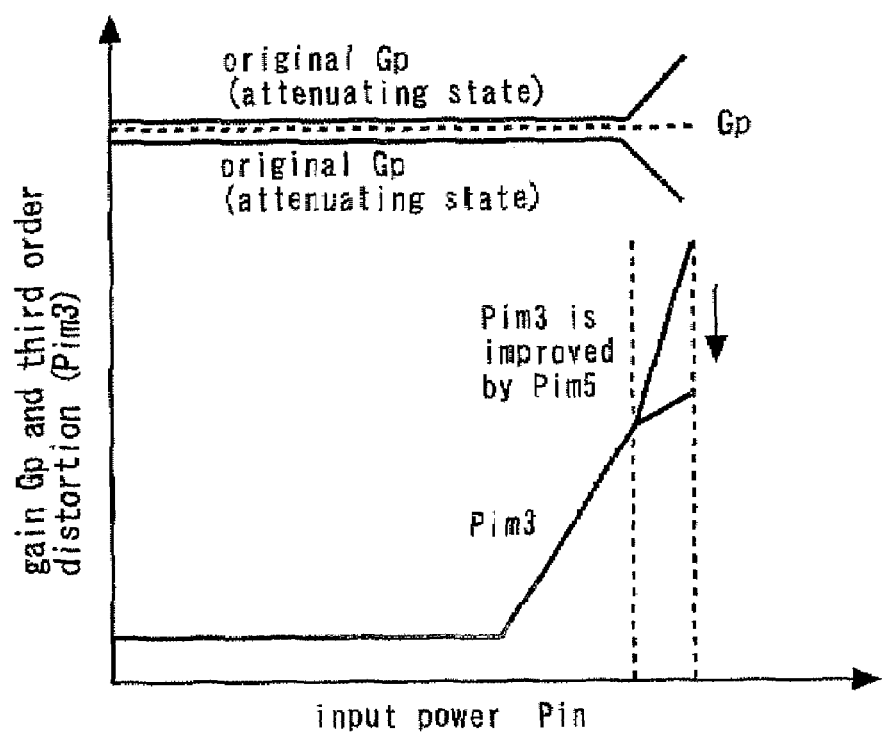
FIG. 5 shows the characteristics of the attenuator of FIG. 1 when it is in its attenuating state.
Figure 15:
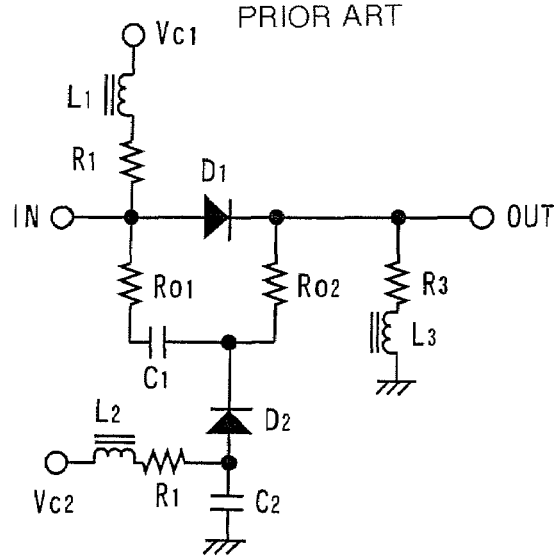
FIG. 15 is a circuit diagram of a conventional attenuator employing a BC diode.
Figure 16:
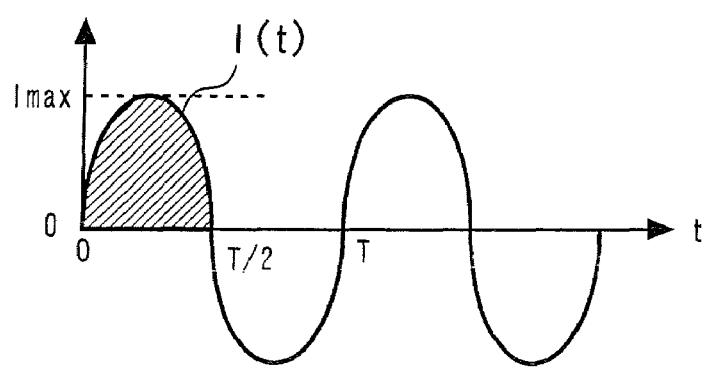
Figure 17:
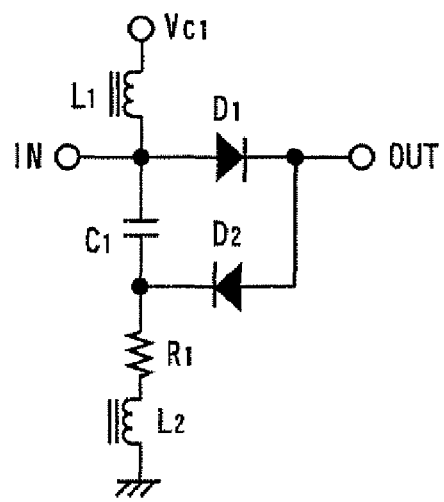
FIG. 17 is a circuit diagram of a devised switch.
Figure 18:
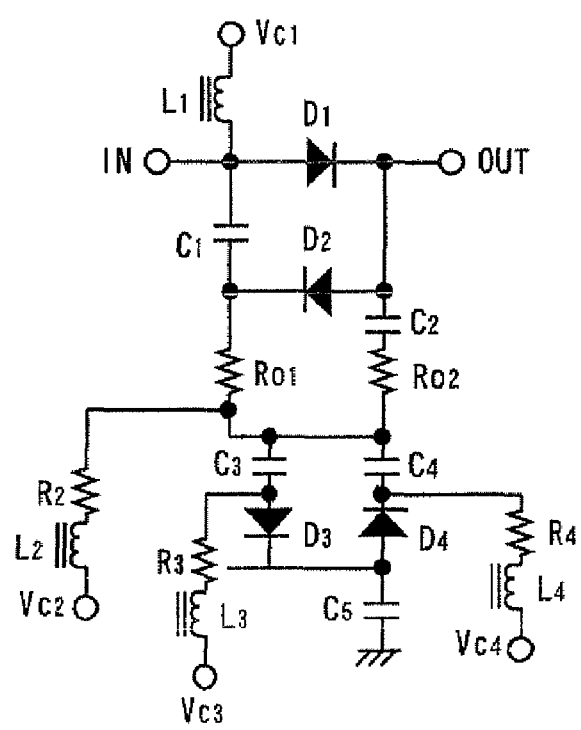
FIG. 18 is a circuit diagram of a devised attenuator.
Figure 19:
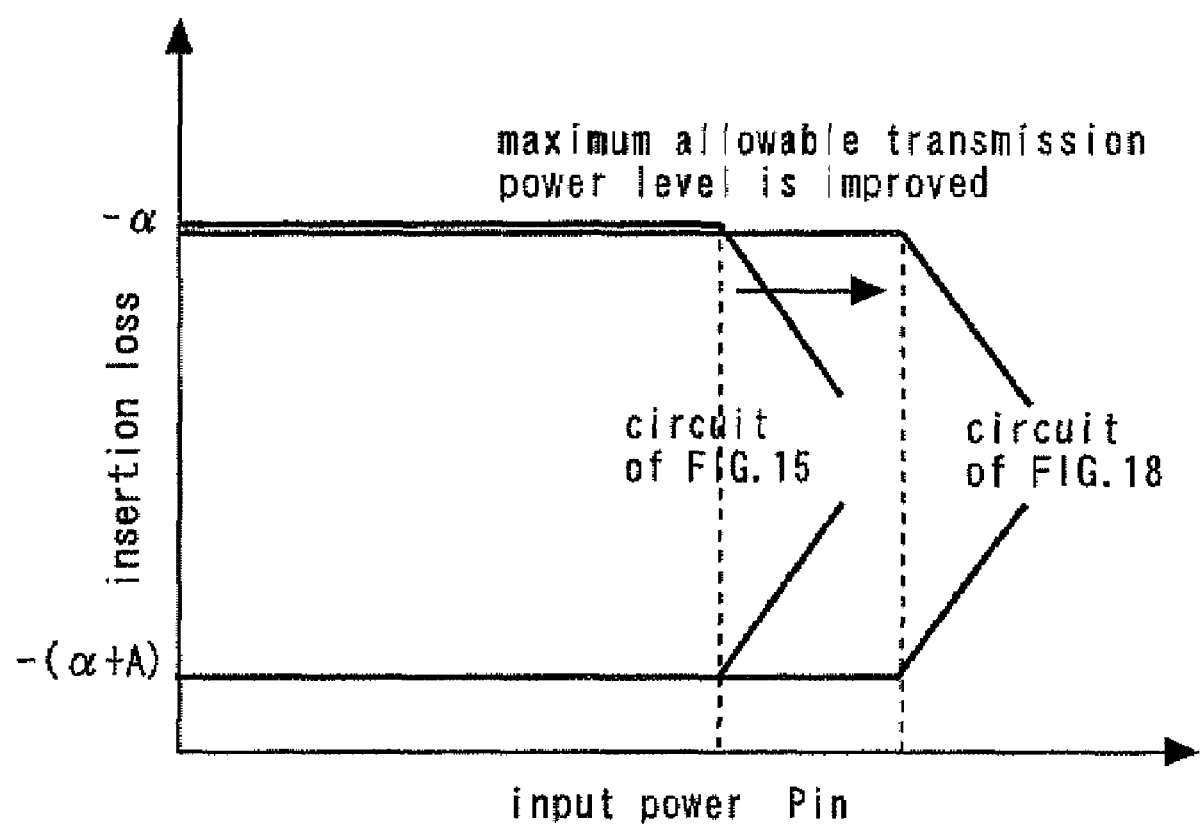
FIG. 19 shows the power transfer characteristics of the attenuators shown in FIGS. 15 and 18.

FIG. 5 shows the characteristics of the attenuator of FIG. 1 when it is in its attenuating state. As shown in the figure, this attenuator has improved gain characteristics and hence improved third order distortion (Pim3) characteristics. (The doted horizontal line in FIG. 5 represents the flat portion of the improved gain curve Gp.) Thus, when in its attenuating state, the attenuator of the present embodiment exhibits improved signal distortion characteristics at high input power, as compared to conventional attenuators. As a result, the attenuator has substantially constant distortion characteristics up to a certain (high) transmission power level both in the attenuating and non-attenuating states. Furthermore, the maximum allowable transmission power level of this attenuator is approximately 6 dB or more higher than that of the attenuator shown in FIG. 15 (assuming the same bias current), as in the case of the attenuator shown in FIG. 18.

Second Embodiment

Figure 6:
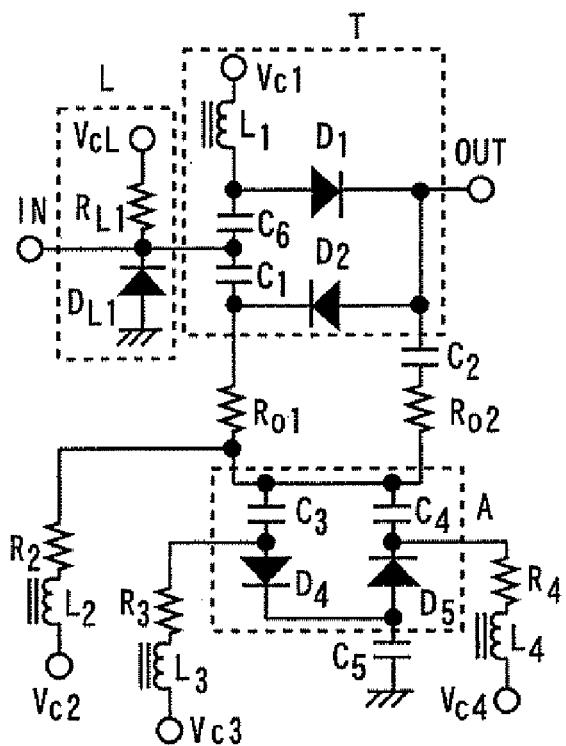
FIG. 6 is a circuit diagram of an attenuator according to a second embodiment of the present invention.

FIG. 6 is a circuit diagram of an attenuator according to a second embodiment of the present invention. This attenuator is similar to that of the first embodiment except that it additionally includes a capacitance C6 (a sixth capacitance) connected between the anode of the diode D1 and the connection point between the capacitance C1 and the input terminal IN. That is, the through arm T of the attenuator of the present embodiment includes two capacitances: capacitance C1 and capacitance C6 (see FIG. 6).

The present embodiment has the same effect as the first embodiment. Furthermore, by having the above through arm T, the present embodiment has the effect of equalizing the power passed through the diodes D1 and D2 (as compared to the first embodiment), resulting in improved signal distortion characteristics when the attenuator is in its non-attenuating state, It should be noted, however, that the insertion loss is slightly increased since (the impedances of) the capacitances C1 and C2 are symmetrically arranged.

Third Embodiment

Figure 7:
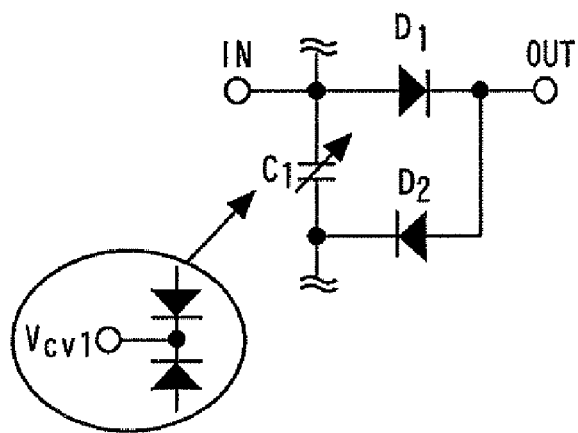
FIG. 7 is a circuit diagram of the through arm of an attenuator according to a third embodiment of the present invention.

FIG. 7 is a circuit diagram of the through arm of an attenuator according to a third embodiment of the present invention. This attenuator is similar to that of the first embodiment except that the capacitance C1 is a variable capacitance. Specifically, the capacitance C1 is made up of two diodes connected in series in reverse polarity. A reverse bias is applied to each series-connected diode through a control voltage terminal Vcv1 (see FIG. 7).

With this arrangement, the voltage applied to the control voltage terminal Vcv1 may be set higher in the attenuating state than in the non-attenuating state. This reduces the value of the capacitance C1 and thereby enhances the isolation of the through arm T in the attenuating state. Therefore, it is possible to reduce the bias currents of the shunt arm A and the values of the capacitances C3 to C5, as compared to the first embodiment (assuming the same amount of attenuation).

Thus, in addition to having the same effect as the first embodiment, the present embodiment allows the circuit size to be reduced.

Further, in the configuration of the second embodiment, the capacitances C1 and C2 may be variable capacitances. This variation also allows the circuit size to be reduced, as well as providing the same effect as the second embodiment.

Fourth Embodiment

Figure 8:
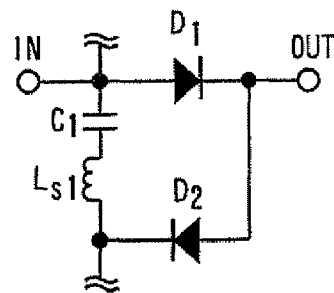
FIG. 8 is a circuit diagram of the through arm of an attenuator according to a fourth embodiment of the present invention.

FIG. 8 is a circuit diagram of the through arm of an attenuator according to a fourth embodiment of the present invention. This attenuator is similar to that of the first embodiment except that it additionally includes an inductor Ls1 connected in series with the capacitance C1 between the cathode of the diode D2 and the anode of the diode D1. The inductor Ls1 series-resonates with the capacitance C1 at a desired frequency.

This arrangement allows the impedance (of the through arm) to be reduced, as compared to the first embodiment, resulting in a reduced RF power loss in the diode 2 side circuit. Therefore, in addition to having the same effect as the first embodiment, the present embodiment allows the insertion loss of the attenuator to be reduced when the attenuator is in its non-attenuating state.

Fifth Embodiment

Figure 9:
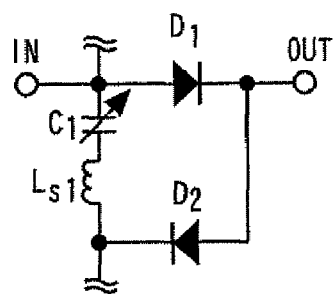
FIG. 9 is a circuit diagram of the through arm of an attenuator according to a fifth embodiment of the present invention.

FIG. 9 is a circuit diagram of the through arm of an attenuator according to a fifth embodiment of the present invention. This attenuator is similar to that of the fourth embodiment except that the capacitance C1 is a variable capacitance. Although the inductor Ls1 works to degrade isolation (both in the attenuating and non-attenuating states), the value of the capacitance C1 may be set lower in the attenuating state than in the non-attenuating state to enhance the isolation of the through arm T in the attenuating state and thereby reduce the insertion loss of the attenuator. As a result, it is possible to reduce the bias currents of the shunt arm A and the values of the capacitances C3 to C5, as compared to the fourth embodiment (assuming the same amount of attenuation). Thus, in addition to having the same effect as the fourth embodiment, the present embodiment allows the circuit size to be reduced.

Sixth Embodiment

Figure 10:
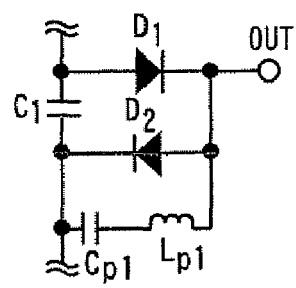
FIG. 10 is a circuit diagram of the through arm of an attenuator according to a sixth embodiment of the present invention.

FIG. 10 is a circuit diagram of the through arm of an attenuator according to a sixth embodiment of the present invention. This attenuator is similar to that of the first embodiment except that it additionally includes a capacitance Cp1 and an inductor Lp1 that are connected in series between the anode and the cathode of the diode D1. That is, the inductor Lp1 is connected in parallel with the diodes D1 and D2. It should be noted that the impedance of the capacitance Cp1 is sufficiently low at a desired frequency. Further, the inductance of the inductor Lp1 is set to parallel-resonate with the junction capacitances of the diodes D1 and D2 and the capacitance C1 at the desired frequency when the attenuator is in its attenuating state.

This allows the isolation of the through arm T to be enhanced when the attenuator is in its attenuating state. As a result, it is possible to reduce the insertion loss of the attenuator and hence reduce the bias currents of the shunt arm A and the values of the capacitances C3 to C5, as compared to the first embodiment (assuming the same amount of attenuation). Thus, in addition to having the same effect as the first embodiment, the present embodiment allows the circuit size to be reduced.

Seventh Embodiment

Figure 11:
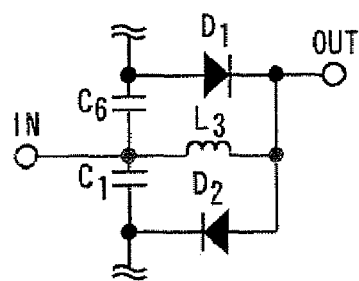
FIG. 11 is a circuit diagram of the through arm of an attenuator according to a seventh embodiment of the present invention.

FIG. 11 is a circuit diagram of the through arm of an attenuator according to a seventh embodiment of the present invention. This attenuator is similar to that of the second embodiment except that it additionally includes a blocking inductor L3 connected between the cathode of the diode D1 and the connection point between the capacitances C1 and C6. That is, the blocking inductor L3 is connected in parallel with the diodes D1 and D2. It should be noted that the inductance of the blocking inductor L3 is set to series-resonate with the junction capacitances of the diodes D1 and D2 and the capacitance C1.

This allows the isolation of the through arm T to be enhanced when the attenuator is in its attenuating state. As a result, it is possible to reduce the insertion loss of the attenuator and hence reduce the bias currents of the shunt arm A and the values of the capacitances C3 to C5, as compared to the first embodiment (assuming the same amount of attenuation). Thus, in addition to having the same effect as the first embodiment, the present embodiment allows the circuit size to be reduced.

According to a variation of the present embodiment, an inductor may be connected in parallel with the diodes D3 and D4. This allows the isolation of the shunt arm A to be enhanced, resulting in a reduced RF power loss when the attenuator is in its non-attenuating state.

Eighth Embodiment

Figure 12:
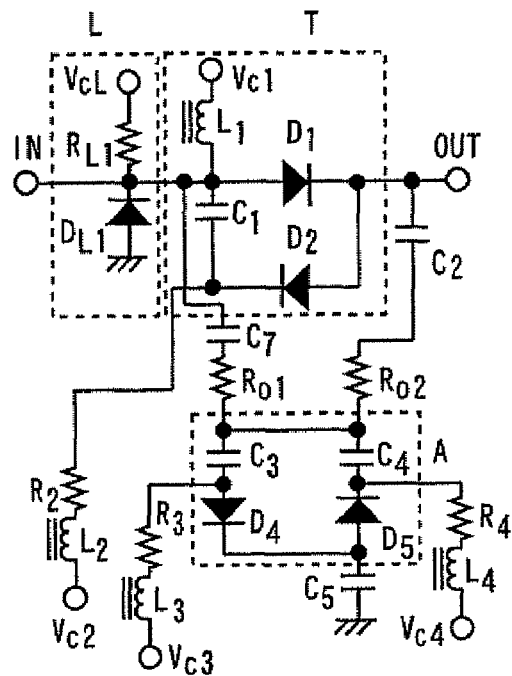
FIG. 12 is a circuit diagram of an attenuator according to an eighth embodiment of the present invention.

FIG. 12 is a circuit diagram of an attenuator according to an eighth embodiment of the present invention. This attenuator is similar to that of the first embodiment. However, according to the eighth embodiment, the control voltage terminal Vc2 is connected to the cathode of the diode D2 directly instead of through the resistance R01. Further, one end of the resistance R01 is connected to the cathode of the diode D2 through a capacitance C7 (a seventh capacitance).

Since the control voltage terminal Vc2 is connected to the cathode of the diode D2 directly instead of through the resistance R01, as described above, this circuit portion is not affected by the voltage drop across the resistance R01, allowing the bias current to be increased, as compared to the first embodiment (assuming the same control voltage). Further, the resistances R01 and R02 and the capacitances C7 and C2 are symmetrically arranged as viewed from the shunt arm A, allowing the signal distortion characteristics to be improved when the attenuator is in its attenuating state. Further, in addition to these effects, the present embodiment has the same effect as the first embodiment.

Ninth Embodiment

Figure 13:
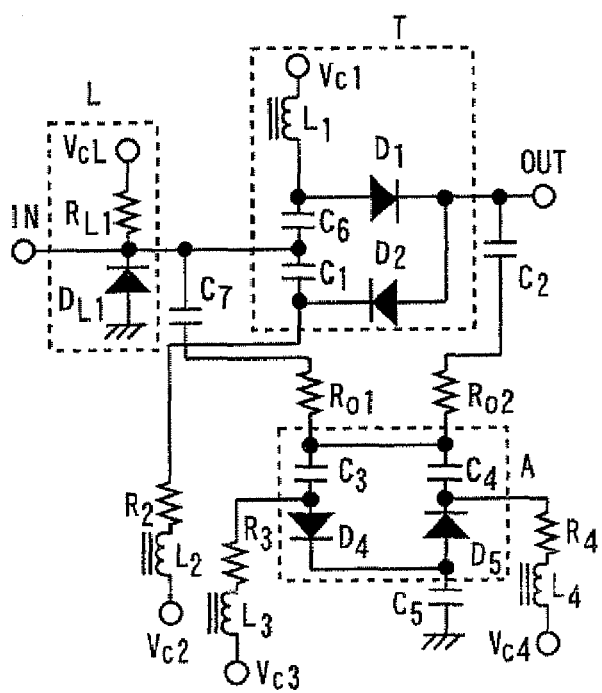
FIG. 13 is a circuit diagram of an attenuator according to a ninth embodiment of the present invention.
Figure 14:
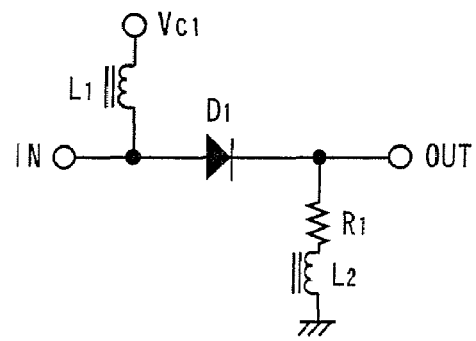
FIG. 14 is a circuit diagram of a conventional switch employing a BC diode.

FIG. 13 is a circuit diagram of an attenuator according to a ninth embodiment of the present invention. This attenuator is similar to that of the eighth embodiment except that it additionally includes a capacitance C6 connected between the anode of the diode D1 and the connection point between the capacitance C1 and the input terminal IN. That is, the through arm T of the attenuator includes two capacitances: capacitance C1 and capacitance C6. Therefore, the present embodiment has the same effects as the second and eighth embodiments.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-137860, filed on May 17, 2006 including specification, claims, drawings and summary, on which the Convention priority of the present application is based, are incorporated herein by reference in its entirety.

What is claimed is:

1. An attenuator comprising:
    a first diode having an anode and a cathode that are connected to an input terminal and an output terminal, respectively;
    a first control voltage terminal connected to said anode of said first diode;
    a first capacitance;
    a second diode having an anode and a cathode, said anode being connected to said cathode of said first diode, said cathode of said second diode being connected to said anode of said first diode through said first capacitance;
    a first resistance connected at a first end to said cathode of said second diode;
    a second capacitance;
    a second resistance connected at a first end to said cathode of said first diode through said second capacitance;
    a third capacitance;
    a third diode having an anode and a cathode, said anode being connected to second ends of said first and second resistances through said third capacitance;
    a fourth capacitance;
    a fourth diode having an anode and a cathode, said cathode being connected to said second ends of said first and second resistances through said fourth capacitance;
    a fifth capacitance connected at a first end to said cathode of said third diode and to said anode of said fourth diode, a second end of said fifth capacitance being grounded;
    a second control voltage terminal connected to said cathode of said second diode;
    a third control voltage terminal connected to said anode of said third diode;
    a fourth control voltage terminal connected to said cathode of said fourth diode; and
    a linearizer provided between said input terminal and said anode of said first diode, wherein said linearizer linearizes a signal input to said input terminal only when low level voltages are applied to said first and fourth control voltage terminals at the same time that high level voltages are applied to said second and third control voltage terminals.

2. The attenuator as claimed in claim 1, wherein said linearizer includes:
    a fifth control voltage terminal;
    a fifth diode having an anode and a cathode, said anode being grounded, said cathode being connected to a connection point between said input terminal and said anode of said first diode; and
    a third resistance connected between said fifth control voltage terminal and said connection point between said input terminal and said anode of said first diode, wherein a low level voltage is applied to said fifth control voltage terminal only when low level voltages are applied to said first and fourth control voltage terminals at the same time that high level voltages are applied to said second and third control voltage terminals.

3. The attenuator as claimed in claim 2, wherein said linearizer further includes a fourth resistance connected between said fifth diode and said connection point between said input terminal and said anode of said first diode.

4. The attenuator as claimed in claim 3, wherein said linearizer further includes a sixth diode having an anode and a cathode, said anode being grounded, said cathode being connected to said anode of said fifth diode.

5. The attenuator as claimed in claim 1, further comprising a sixth capacitance connected between said anode of said first diode and a connection point between said first capacitance and said input terminal.

6. The attenuator as claimed in claim 1, wherein said first capacitance is a variable capacitance.

7. The attenuator as claimed in claim 1, further comprising an inductor connected in series to said first capacitances, between said cathode of said second diode and said anode of said first diode, said inductor series-resonating with said first capacitance.

8. The attenuator as claimed in claim 1, further comprising an inductor connected in parallel with said first and second diodes, said inductor parallel-resonating with junction capacitances of said first and second diodes and said first capacitance.

9. The attenuator as claimed in claim 1, including a seventh capacitances, wherein said first end of said first resistance is connected to said cathode of said second diode through said seventh capacitance.

* * * * *